US009419314B2

United States Patent
Koch et al.

(10) Patent No.: US 9,419,314 B2
(45) Date of Patent: Aug. 16, 2016

(54) SYSTEMS AND METHODS FOR DETERMINING BATTERY SYSTEM POWER CAPABILITY

(71) Applicant: GM GLOBAL TECHNOLOGY OPERATIONS LLC, Detroit, MI (US)

(72) Inventors: Brian J. Koch, Berkley, MI (US); Brett B. Stawinski, Royal Oak, MI (US); Patrick Frost, Berkley, MI (US); Damon R. Frisch, Troy, MI (US); John E. Novak, Dexter, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 171 days.

(21) Appl. No.: 14/275,553

(22) Filed: May 12, 2014

(65) Prior Publication Data

US 2015/0321572 A1 Nov. 12, 2015

(51) Int. Cl.
*B60L 15/20* (2006.01)
*H01M 10/48* (2006.01)
*B60L 11/18* (2006.01)
*G01R 21/14* (2006.01)
*G01R 31/36* (2006.01)

(52) U.S. Cl.
CPC .......... *H01M 10/48* (2013.01); *B60L 11/1851* (2013.01); *B60L 15/20* (2013.01); *B60L 15/2009* (2013.01); *G01R 21/14* (2013.01); *G01R 31/36* (2013.01); *G01R 31/361* (2013.01); *G01R 31/3648* (2013.01); *G01R 31/3693* (2013.01); *Y02T 10/7005* (2013.01); *Y02T 10/7275* (2013.01)

(58) Field of Classification Search
CPC .... G01R 31/00; G01R 31/36; G01R 31/3606; G01R 31/3627; G01R 31/3634; G01R 21/00; G01R 21/001; G01R 21/006; H01M 8/48; H01M 8/04604; H01M 8/04925
USPC .............................. 701/22, 99; 702/57, 60, 63
See application file for complete search history.

(56) References Cited

U.S. PATENT DOCUMENTS

| | | | | |
|---|---|---|---|---|
| 5,140,269 A * | 8/1992 | Champlin | ........ | G01R 19/16542 320/132 |
| 9,067,504 B1 * | 6/2015 | Lee | ..................... | B60L 11/1851 |
| 2003/0076109 A1 * | 4/2003 | Verbrugge | ........... | G01R 31/362 324/427 |
| 2003/0094321 A1 * | 5/2003 | Hirata | .................. | B60L 11/1851 180/65.245 |
| 2004/0128089 A1 * | 7/2004 | Barsoukov | ......... | G01R 31/3662 702/65 |
| 2004/0162683 A1 * | 8/2004 | Verbrugge | ........... | G01R 31/361 702/64 |
| 2004/0239332 A1 * | 12/2004 | Mackel | .................. | H02J 7/0047 324/426 |
| 2009/0109046 A1 * | 4/2009 | Gielniak | ............ | G01R 31/3679 340/636.12 |

(Continued)

*Primary Examiner* — Thomas G Black
*Assistant Examiner* — Sara Lewandroski
(74) *Attorney, Agent, or Firm* — Phillips Ryther & Winchester; John P. Davis (57) ABSTRACT

System and methods for determining battery system power capability in a vehicle are presented. Peak power capability estimation systems and methods disclosed herein may compensate regressed parameters in a battery system circuit model for an effect of current magnitude. Utilizing the disclosed methods for accurately estimating peak power capability of a battery system may provide for, among other things, improved battery system performance modeling and/or improved battery system control and management decisions.

19 Claims, 8 Drawing Sheets

(56) References Cited

U.S. PATENT DOCUMENTS

| | | | |
|---|---|---|---|
| 2010/0121591 A1* | 5/2010 | Hall | G01R 31/3651 702/63 |
| 2011/0224928 A1* | 9/2011 | Lin | G01R 31/3651 702/63 |
| 2011/0264381 A1* | 10/2011 | Gering | H01M 10/48 702/32 |
| 2011/0301931 A1* | 12/2011 | Gering | G01R 31/3679 703/13 |
| 2012/0101674 A1* | 4/2012 | Wang | G01R 31/3651 701/22 |
| 2012/0119749 A1* | 5/2012 | Iida | H01M 10/441 324/435 |
| 2013/0076314 A1* | 3/2013 | Nagakura | H01M 10/44 320/162 |
| 2014/0111214 A1* | 4/2014 | Sejima | G01R 31/362 324/426 |
| 2015/0197164 A1* | 7/2015 | Lee | B60L 11/1864 701/22 |

* cited by examiner

SYSTEMS AND METHODS FOR DETERMINING BATTERY SYSTEM POWER CAPABILITY

TECHNICAL FIELD

This disclosure relates to systems and methods for determining power capability of a battery system. More specifically, but not exclusively, the systems and methods disclosed herein relate to determining power capability of a battery system in connection with battery system control and/or management decisions.

BACKGROUND

Passenger vehicles often include electric batteries for operating features of a vehicle's electrical and drivetrain systems. For example, vehicles commonly include a 12V lead-acid automotive battery configured to supply electric energy to vehicle starter systems (e.g., a starter motor), lighting systems, and/or ignition systems. In electric, fuel cell ("FC"), and/or hybrid vehicles, a high voltage ("HV") battery system (e.g., a 360V HV battery system) may be used to power electric drivetrain components of the vehicle (e.g., electric drive motors and the like). For example, an HV rechargeable energy storage system ("ESS") included in a vehicle may be used to power electric drivetrain components of the vehicle.

Information regarding power capability of a battery system may be utilized in modeling battery system performance and/or in connection with battery system control and/or management decisions. A battery state estimation ("BSE") system may be used to predict power capability of a battery system. Under most operating conditions, a battery system may have a power capability that exceeds the capabilities of associated motors and power electronics in a vehicle. For low temperature operation, however, electrochemical processes at work within the battery system may be slowed to point that there remains little margin to meet the power demands of the system. An accurate estimate of battery system power capability may be important in such a situation. A small over-prediction of power capability can lead to failed attempts to crank an engine or erratic vehicle acceleration, while a similarly small under-prediction of power can temporarily disable the propulsion system. Therefore, a BSE system that properly interprets the effects of low temperature on the battery is desirable.

SUMMARY

Systems and methods disclosed herein may provide for improved determination of information regarding battery system power capability. Information regarding power capability of a battery system may be utilized in connection with a variety of applications including, without limitation, modeling battery system performance and/or battery system control and/or management decisions.

Temperature may affect the thermodynamics and kinetics of battery energy conversion processes. First principles models of mass transport, charge transfer, and capacitive phenomena may represent the decline of power capability with falling temperature. Such models, however, may be quite complex and may involve a great deal of computational throughput. A more computationally efficient approach to battery state estimation for real-time, onboard vehicle use may utilize an equivalent circuit model, which in a semi-empirical manner may provide simple electrical analogies for electrochemical processes. Through a combination of series and parallel resistors, capacitors, and a voltage source, an equivalent circuit may approximate the response of battery voltage to a current flow. On the whole, this approach can provide an effective representation of the battery because of the tuning flexibility afforded by having a sufficient number of circuit components and parameters. In certain circumstances, however, it may be difficult to directly attribute an observed effect on battery performance (e.g., due to temperature) to a particular element in a circuit model. Accordingly, in some embodiments, translation between components of the circuit model and corresponding first principles processes may be utilized.

Circuit-model-to-first-principles translation may be utilized to interpret electrochemical reaction kinetics with an associated circuit model. In the first principles realm, the kinetic resistance of an electrochemical process may be a function of electrode overpotential and temperature. Low temperature may cause a general increase and/or a strengthening of the dependence of kinetic resistance to overpotential. These factors may cause kinetic resistance to be largely responsible for the reduction in cold power capability experienced by most batteries.

When using a battery system, at least the following may be observed: 1) parameter values assigned by a battery estimator algorithm to one or more of the components in an associated circuit model may vary with overpotential and temperature, 2) the parameters values may be correlated with the prevailing conditions of overpotential and temperature at the time they were assigned, and 3) the correlations may bear at least a qualitative resemblance to the form of the first principles predictions for the dependence of kinetic resistance on overpotential and temperature. As parameter values may be correlated with prevailing conditions of overpotential and temperature, it may be implied that the solution of any BSE power equation using these model parameters may also be correlated to the overpotential and temperature that prevailed when the parameters were assigned. To convert the parameters to their peak overpotential values, parameters may be scaled in a manner that is partly or wholly aligned with the first principles form of the overpotential dependence of kinetic resistance at a given temperature. In certain embodiments, model parameter values and the kinetic resistance may be expressed instead as a function of current. Scaling model parameters consistent with embodiments disclosed herein with respect to overpotential or current may be performed in a variety of applications and may be used with any model parameters dependent on such variables.

Consistent with embodiments disclosed herein, power capability estimation accuracy may be improved by compensating regressed parameters in a battery system circuit model for an effect of overpotential, or in an equivalent manner, for the effect of current magnitude. Particularly, the disclosed systems and methods may utilize current-dependent circuit model parameters in connection with power capability estimations, thereby increasing accuracy of such estimations. In certain embodiments, the systems and methods disclosed herein may increase available battery power utilized in connection with battery system control and/or management decisions over a larger window of operating conditions. In certain embodiments, power capability of a battery system may be defined for situations where the battery system reaches a current and/or a voltage limit.

In certain embodiments, power capability estimations may be performed by a BSE system and/or another battery control and/or monitoring system using, at least in part, a circuit model of a battery system. Among other things, the circuit model may incorporate elements modeling ohmic resistance, charge transfer, and/or mass transfer processes in a battery system. In certain embodiments, such processes may be modeled by resistors and/or resistor/capacitor pairs included in the circuit model. Consistent with embodiments disclosed herein, in some embodiments, certain circuit model parameters may be compensated for an effect of current magnitude.

In certain embodiments, a method of determining a peak power capability of a battery system may include identifying a peak current of the battery system. In embodiments where the peak power capability comprises a current-limited peak power capability, the peak current of the battery system may be a maximum current limit of the battery system.

In embodiments, where the peak power capability comprises a voltage-limited peak power capability, identifying the peak current may include generating a guessed current, determining a guessed resistance based on the guessed current using current dependent resistance information associated with a model the battery system, determining a calculated current based on the guessed resistance, and determining whether a difference between the calculated current and the guessed current is below a threshold.

If the difference between the calculated current and the guessed current is below the threshold, the calculated current may be identified as the peak current. If, however, the difference between the calculated current and the guessed current is not below the threshold, identifying the peak current may include iteratively generating subsequent guessed currents, determining subsequent guessed resistances based on the subsequent guessed currents, and determining subsequent calculated currents based on the subsequent guessed currents until a difference between a final subsequent calculated current and a final subsequent guessed current is below the threshold. The final subsequent calculated current may then be identified as the peak current.

The method may further include determining a regressed ohmic resistance in a battery system model used to model the battery system. The regressed ohmic resistance may be scaled to calculate a compensated ohmic resistance of the battery system model based on the peak current. In certain embodiments, this scaling operation, may include determining a peak resistance based on the peak current, determining an average regressed resistance based on an average current associated with a regression operation used to calculate the regressed ohmic resistance, and scaling the regressed ohmic resistance by a ratio of the peak resistance to the average regressed resistance to calculate the compensated ohmic resistance.

A peak power capability of the battery system may be determined based on the compensated ohmic resistance and the battery system model. In certain embodiments, one or more control actions in a vehicle associated with the battery system may be implemented based on the determined peak power capability. For example, control actions associated with a maximum allowed vehicle acceleration, initiated of an electric drivetrain system of a vehicle, and/or actions associated with regenerative braking (e.g., regenerative braking acceptance) may be performed.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

A detailed description of systems and methods consistent with embodiments of the present disclosure is provided below. While several embodiments are described, it should be understood that the disclosure is not limited to any one embodiment, but instead encompasses numerous alternatives, modifications, and equivalents. In addition, while numerous specific details are set forth in the following description in order to provide a thorough understanding of the embodiments disclosed herein, some embodiments can be practiced without some or all of these details. Moreover, for the purpose of clarity, certain technical material that is known in the related art has not been described in detail in order to avoid unnecessarily obscuring the disclosure.

The embodiments of the disclosure will be best understood by reference to the drawings, wherein like parts may be designated by like numerals. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

Systems and methods disclosed herein may provide for improved estimation and/or determination of information relating to a power capability of a battery system. Power capability determinations may be performed by a BSE system and/or another battery control, monitoring, and/or management system. In some embodiments, a circuit model of a battery system that includes parameters compensated for an effect of current magnitude may be utilized in connection with power capability determinations.

Consistent with embodiments disclosed herein, using circuit model parameters that reflect current dependent behaviors may increase the accuracy of associated power capability determinations. Among other things, this increase in accuracy may allow for more consistent drivability and/or improved performance of a vehicle associated with a battery system, particularly during low-temperature operation. In some embodiments, the disclosed systems and methods for determining a power capability of a battery system may allow for increased discharge (e.g., allowing quicker acceleration) and/or charge (e.g., improving regenerative braking or recharging operations) of the battery system than conventional methods, thereby improving operation of an associated vehicle. For example, by accurately determining a maximum power capability of a battery system associated with a vehicle, acceleration of the vehicle may be improved, hybrid-electric vehicle functionality may initiate earlier in a low-temperature drive cycle, regenerative braking acceptance may be increased for better vehicle efficiency, and the battery system may be more fully utilized.

Figure 1:
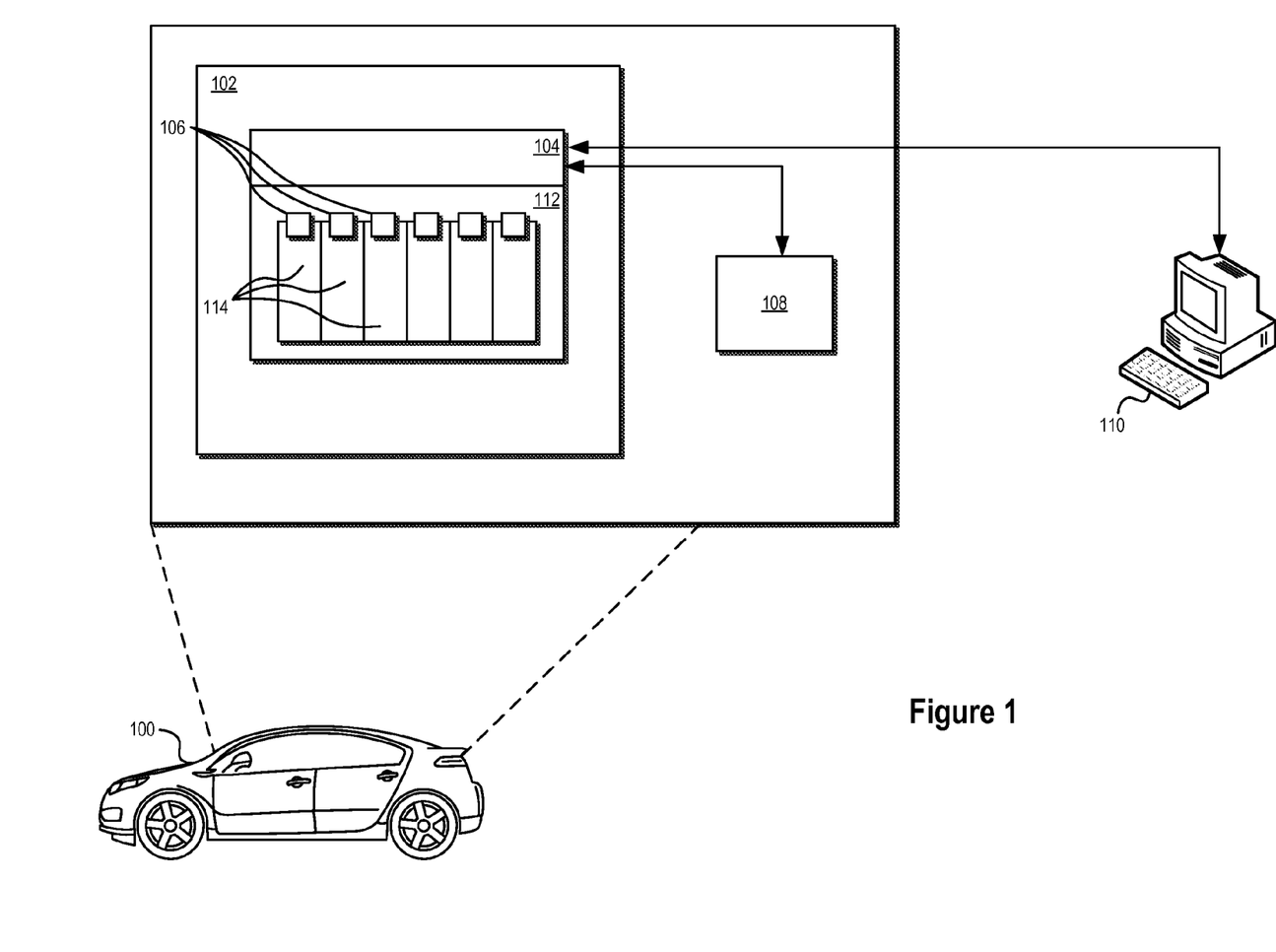
FIG. 1 illustrates an exemplary system for determining power capability of a battery system included in a vehicle consistent with embodiments disclosed herein.

FIG. 1 illustrates an exemplary system for determining power capability of a battery system 102 consistent with embodiments disclosed herein. In certain embodiments, the battery system 102 may be included in a vehicle 100. The vehicle 100 may be a motor vehicle, a marine vehicle, an aircraft, and/or any other type of vehicle, and may include an internal combustion engine ("ICE") drivetrain, an electric motor drivetrain, a hybrid engine drivetrain, an FC drivetrain, and/or any other type of drivetrain suitable for incorporating the systems and methods disclosed herein. The vehicle 100 may include a battery system 102 that, in certain embodiments, may be an HV battery system. The HV battery system may be used to power electric drivetrain components (e.g., as in an electric, hybrid, or FC power system). In further embodiments, the battery system 102 may be a low voltage battery (e.g., a lead-acid 12V automotive battery) and may be configured to supply electric energy to a variety of vehicle 100 systems including, for example, vehicle starter systems (e.g., a starter motor), lighting systems, ignition systems, and/or the like.

The battery system 102 may include a battery control system 104. The battery control system 104 may be configured to monitor and control certain operations of the battery system 102. For example, the battery control system 104 may be configured to monitor and control charging and discharging operations of the battery system 102. In certain embodiments, the battery control system 104 may be utilized in connection with the methods disclosed herein to estimate, model, and/or otherwise determine battery system power capability. In certain embodiments, the battery control system 104 may be communicatively coupled with one or more sensors 106 (e.g., voltage sensors, current sensors, and/or the like, etc.) and/or other systems (e.g., vehicle computer system 108, external computer system 110, etc.) configured to enable the battery control system 104 to monitor and control operations of the battery system 102 and/or perform certain methods disclosed herein. For example, sensors 106 may provide battery control system 104 with information used to estimate a SOC and/or a SOH, estimate an impedance, measure a current, measure voltage of a battery pack 112 and/or constituent battery cells 114, and/or any other information that may be utilized in connection with the disclosed embodiments.

The battery control system 104 may further be configured to provide information to and/or receive information from other systems (e.g., vehicle computer system 108) included in the vehicle 100. For example, the battery control system 104 may be communicatively coupled with an internal vehicle computer system 108 and/or an external computer system 110 (e.g., via a wired and/or wireless telecommunications system or the like). In certain embodiments, the battery control system 104 may be configured, at least in part, to provide information regarding the battery system 102 (e.g., information measured by sensors 106 and/or determined by control system 104) to a user, testing personnel, service personnel, and/or the like of the vehicle 100, the vehicle computer system 108, and/or the external computer system 110. Such information may include, without limitation, battery SOC and/or SOH information, battery power capability information, battery operating time information, battery cycle information, battery operating temperature information, and/or any other information regarding the battery system 102 that may be utilized in connection with determining battery system power capability information.

The battery system 102 may include one or more battery packs 112 suitably sized to provide electrical power to the vehicle 100. Each battery pack 112 may include one or more battery cells 114. The battery cells 114 may utilize any suitable battery technology or combination thereof. Suitable battery technologies may include, for example, lead-acid, nickel-metal hydride ("NiMH"), lithium-ion ("Li-Ion"), Li-Ion polymer, zinc-air, lithium-air, nickel-cadmium ("NiCad"), valve-regulated lead-acid ("VRLA") including absorbed glass mat ("AGM"), nickel-zinc ("NiZn"), molten salt (e.g., a Na—NiCl$_2$ battery), and/or other suitable battery technologies. Each battery cell 114 may be associated with sensors 106 configured to measure one or more parameters (e.g., voltage, current, temperature, etc.) associated with each cell 114. Although FIG. 1 illustrates separate sensors 106 associated with each battery cell 114, in some embodiments a sensor configured to measure various electrical parameters associated with a plurality of cells 114 may also be utilized.

Information measured by sensors 106 may be provided to the battery control system 104 and/or one or more other systems (e.g., vehicle computer system 108 and/or external computer system 110). Using the information, the battery control system 104 and/or any other suitable system may coordinate the operation of battery system 102 (e.g., charging operations, discharging operations, balancing operations, etc.). The battery control system 104, vehicle computer system 108, external computer system 110, and/or any other suitable system implementing BSE methods may further utilize such information in connection with the disclosed embodiments to determine battery system 102 power capability as part of monitoring, control, characterization, and/or modeling activities.

Figure 2A:
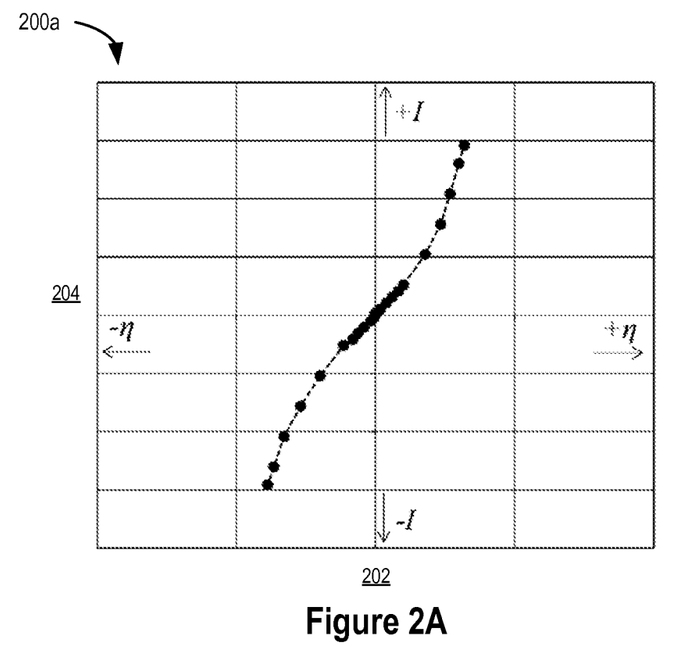
FIG. 2A illustrates a graph showing an exemplary relationship between overpotential and current in an exemplary circuit model consistent with embodiments disclosed herein.

FIG. 2A illustrates a graph 200a showing an exemplary relationship between overpotential and current in an exemplary circuit model consistent with embodiments disclosed herein. The x-axis 202 represents overpotential (e.g., η) and the y-axis 204 represents current (e.g., I). Battery systems may exhibit current-dependent resistance ("IDR") behavior(s). IDR may be attributed to a current-potential relationship of the electrochemical system of a battery. This relationship, which may be known as the Bulter-Volmer relationship, may describe the kinetics of charge (i.e., electron) transfer in a battery system, and may be expressed according to the following:

$$I = i_o A [e^{\alpha f \eta} - e^{(-1-\alpha)f\eta}] \qquad \text{Eq. 1}$$

where
 I=current
 $i_o$=exchange current density
 A=electrode surface area
 α=transfer coefficient
 f=nF/RT (n=number of electrons transferred, F=Faraday constant, R=gas constant, T=temperature)
 η=overpotential According to Equation 1, the current may vary directly with the applied overpotential. The effective resistance for the process may vary inversely with current (i.e., $R=\eta/I$).

In certain embodiments, overpotential may be calculated according to a current flow through the circuit model as the difference between the modeled electrode or cell potential and equilibrium electrode or cell potential ($\eta = V_{model} - V_o$).

Figure 2B:
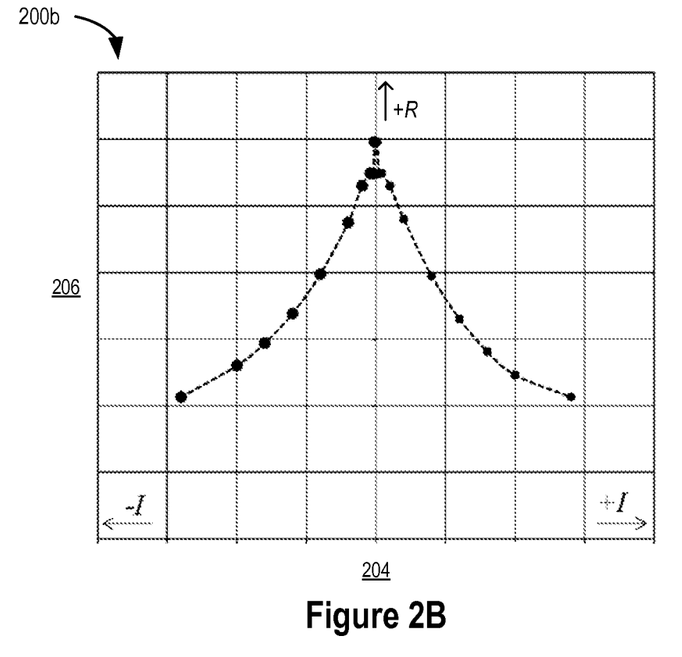
FIG. 2B illustrates a graph showing an exemplary relationship between current and resistance in an exemplary circuit model consistent with embodiments disclosed herein.

In connection with BSE and/or modeling methods, expressing overpotential-dependent resistance as current-dependent resistance may provide certain modeling conveniences and/or efficiencies. FIG. 2B illustrates a graph 200b showing an exemplary relationship between current 204 and resistance 206 consistent with embodiments disclosed herein. In certain embodiments, the current-dependent resistance information shown in graph 200b may be derived from the overpotential and current illustrated in FIG. 2A in connection with graph 200a. Although illustrated in connection with a graph 200b, it will be appreciated that in other embodiments, information included in graph 200b utilized in connection with the disclosed systems and methods may additionally and/or alternatively be included in an associated table of current-dependent resistances. As discussed in more detail below, information included in graph 200b may be utilized in connection with systems and methods for determining a peak current of a battery system and/or a compensated ohmic resistance of a battery system model consistent with embodiments disclosed herein.

Figure 3:
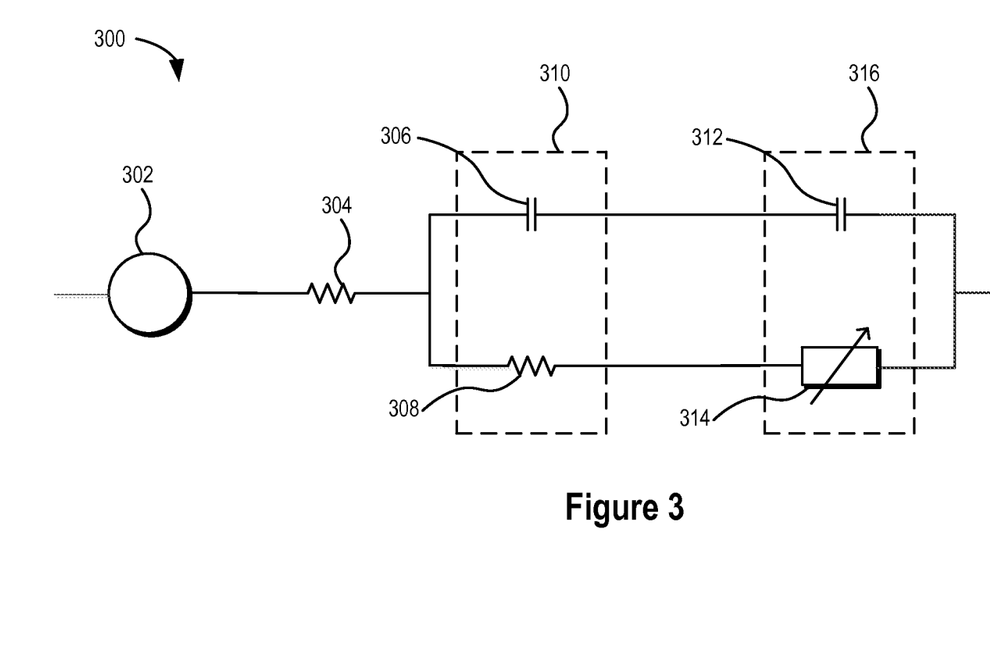
FIG. 3 illustrates an exemplary circuit model for modeling a battery system consistent with embodiments disclosed herein.

FIG. 3 illustrates an exemplary circuit model 300 for modeling a battery system consistent with embodiments disclosed herein. In certain embodiments, a circuit model 300 representation of a battery system may model certain electrochemical processes in a battery system that may be utilized in connection with BSE and/or other battery information determination systems and methods. The illustrated model 300 may include a voltage source 302 modeling an open circuit voltage, resistors 304, 308, 314, and capacitors 306, 312. The voltage source 102 may be serially coupled with resistor 304 and resistor-capacitor pairs 310, 316. Among other things, the circuit model may incorporate elements modeling ohmic resistance, charge transfer, and/or mass transfer processes in a battery system.

Resistor 304 may model ohmic resistance, Ro, in the battery system. In certain embodiments, resistor-capacitor pair 310 may model certain charge transfer processes in a battery system. Resistor 318 may model charge transfer resistance, Rct, and capacitor 306 may model accumulation of charge at the electrode-electrolyte interface (i.e., an electrical double layer), Cdl. In certain embodiments, resistor 318 may further model rapid mass transport in an electrolyte of the battery system. Resistor-capacitor pair 316 may model certain mass transfer properties in the battery system, where together resistor 314 Rdiff, and capacitor 312, Cdiff may provide an empirical approximation of overpotential due to this phenomenon In some battery chemistries (e.g., lithium battery chemistries), charge transfer may be a relatively fast process, and thus may be lumped into resistor 304 in the illustrated model, as ohmic resistance may have a relatively fast response to current. In connection with the disclosed systems and methods, ohmic resistance, $R_o$, of resistor 304 may be considered to be overpotential and/or current dependent.

Ohmic resistance, $R_o$, may be utilized in connection with determining a peak power capability of a battery system. In certain embodiments, peak power of the battery system under conditions of constant current, P, may be calculated according to the following:

$$P = I[V_o + I(R_o + R_{ct})] + [I(V_{init} + IR_o - I_{init}R_o) - I(V_o + I(R_o + R_{ct}))]e^{-t/R_{ct}C_{dl}} \quad \text{Eq. 2}$$

or under conditions of constant voltage according to the following:

$$P = \frac{V(V - V_o)}{R_o + R_{ct}} + V\left(\frac{V - V_{init}}{R_o} + I_{init} - \frac{V - V_o}{R_o + R_{ct}}\right)\exp\left[-\left(\frac{R_o + R_{ct}}{R_o R_{ct} C_{dl}}\right)t\right] \quad \text{Eq. 3}$$

where
I=a current limit (such as the peak current)
V=a voltage limit
$V_o$=the equilibrium battery voltage
$R_o$=ohmic resistance
$R_{ct}$=charge transfer resistance
$C_{dl}$=double layer capacitance
$V_{init}$=battery voltage at the onset of the power prediction
$I_{init}$=battery current at the onset of the power prediction
t=time (seconds) in the future at which power is predicted In certain power capability determination methods, a BSE system and/or other suitable system may regress a value associated with ohmic resistance in a battery system model by considering a window of measured current and/or voltage data. The regressed value may represent a level of current the battery has recently experienced in a particular time. The current associated with the regression, however, may be lower than a peak current of the battery system. Accordingly, the regressed ohmic resistance may be too high to accurately predict peak power capability of the battery system, and a resulting peak power capability determination using the regressed ohmic resistance may be under-predicted.

Consistent with embodiments of the disclosed systems and methods, current compensation may be used to more accurately determine an ohmic resistance in a battery system model. Utilizing such methods may allow for more accurate determinations of power capability of a battery system, thereby providing at least some of the previously described benefits of knowledge of accurate power capability information.

Figure 4:
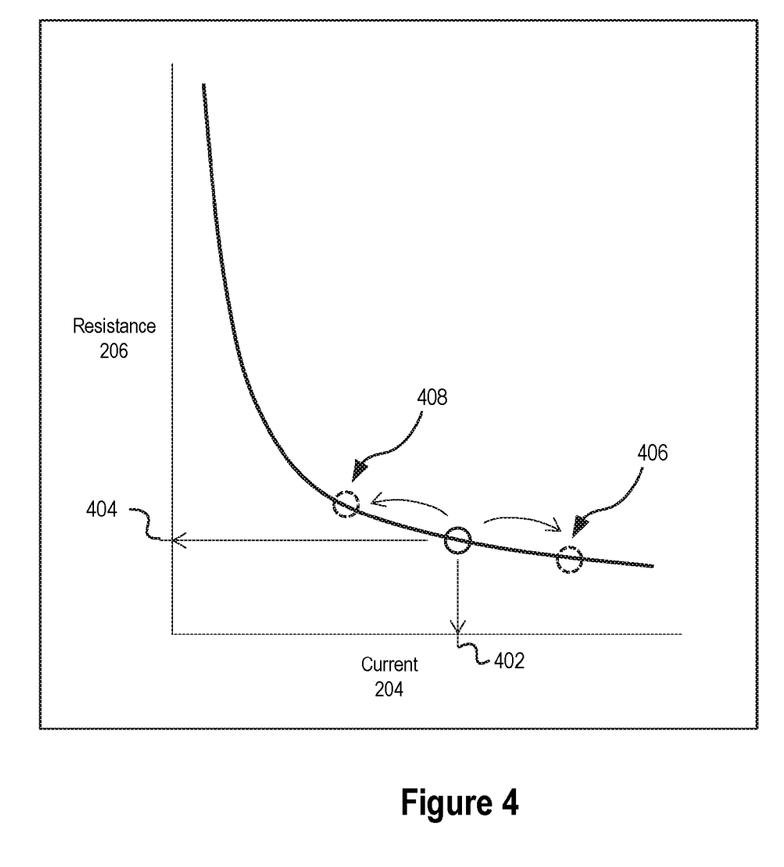
FIG. 4 illustrates a conceptual diagram of a method for determining a peak current of a battery system using a relationship between current and resistance consistent with embodiments disclosed herein.

A peak current may be determined as part of a process for determining an ohmic resistance in a battery system model consistent with embodiments of the disclosed systems and methods. FIG. 4 illustrates a conceptual diagram of a method for determining a peak current of a battery system consistent with certain disclosed embodiments. The method of determining a peak current of a battery system may utilize information regarding a relationship between current 204 and resistance 206 (e.g., as discussed above in connection with graph 200b illustrated in FIG. 2B).

In certain embodiments, systems and methods for determining a peak current of a battery system may implement an iterative search routine configured to find a combination of current 204 and resistance 206 that may drive the battery system to its voltage limit under current operating conditions. The method may begin by making an initial guess at a current/resistance pair, $I_{guess}$ 402 and $R_{guess}$ 404, using the current-dependent resistance relationship information. A current may be calculated using the guessed resistance $R_{guess}$ 404, a minimum operating voltage $V_{min}$, and an open circuit voltage $V_o$ according to the following:

$$I_{calc} = \frac{V_{min} - V_o}{R_{guess}} \quad \text{Eq. 3}$$

After calculating the current, $I_{calc}$, the calculated current may be compared to the guessed current, $I_{guess}$. If the absolute value of the difference between the calculated current and the guessed current is less than a threshold, the calculated current may be determined to be the peak current for the battery system, $I_{peak}$. In certain embodiments, the threshold may comprise any suitable number intended to reduce a number of iterations of the associated calculation.

If the difference between the calculated current and the guessed current is not less than the threshold, and if the calculated current is less than the guessed current, the search routine may guess a new current/resistance pair (e.g., point 406) having higher guessed current and lower guessed resistance values. A new current may be calculated in the manner detailed above, and the comparison between the new calculated current and the new guessed current may be performed again.

If the difference between the calculated current and the guessed current is not less than the threshold, and if the calculated current is more than the guessed current, the search routine may guess a new current/resistance pair (e.g., point 408) having lower guessed current and higher guessed resistance values. A new current may be calculated in the manner detailed above, and the comparison between the new calculated current and the new guessed current may be performed again.

Figure 5:
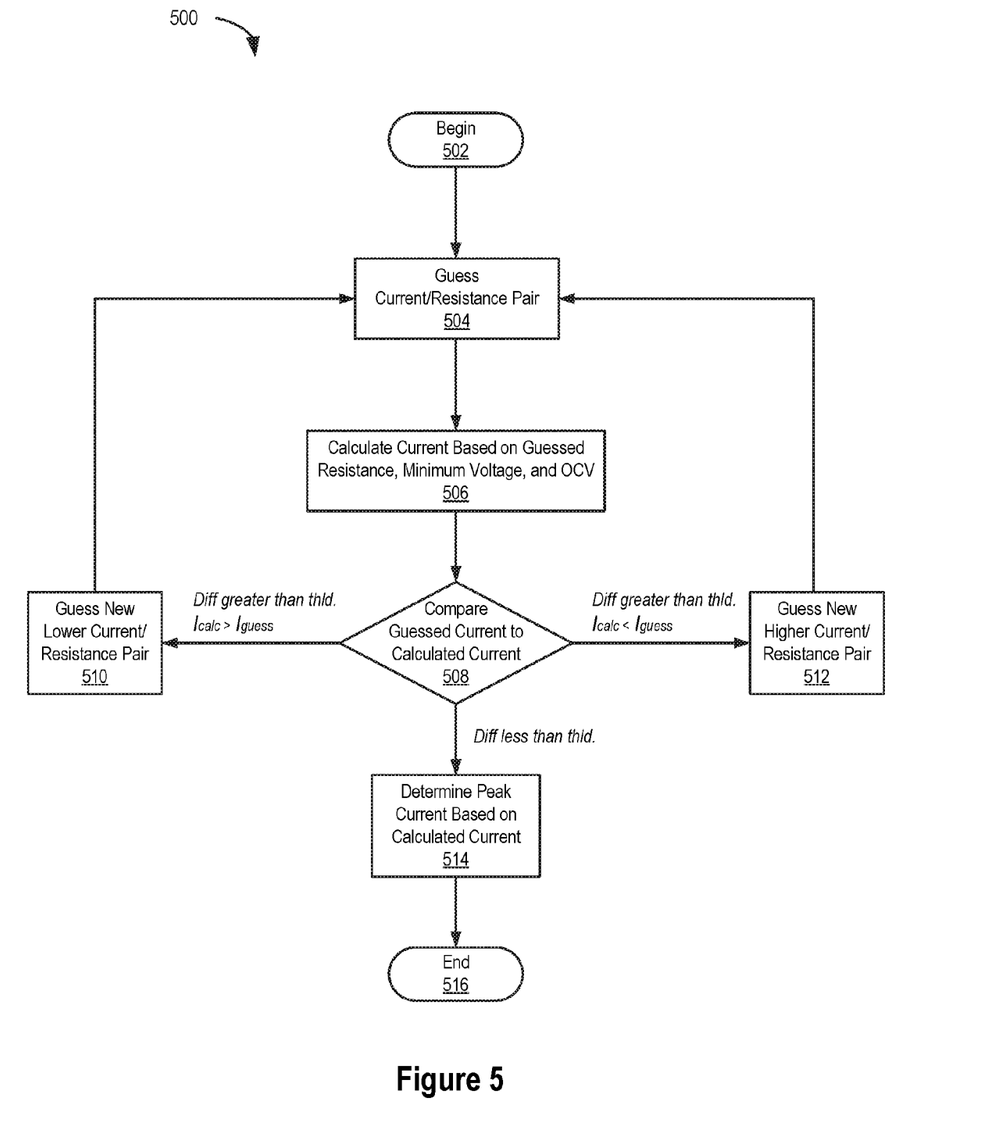
FIG. 5 illustrates a flow chart of an exemplary method for determining a peak current of a battery system consistent with embodiments disclosed herein.

FIG. 5 illustrates a flow chart of an exemplary method 500 for determining a peak current of a battery system consistent with embodiments disclosed herein. In certain embodiments, one or more of the illustrated elements of method 500 may be performed by and/or implemented using a battery control system, a vehicle computer system, an external computer system, and/or any other system or combination of systems configured implemented BSE methods and/or, monitor, model, and/or otherwise characterize power capacity of a battery system.

At 502, the method may initiate. At 504, an initial guess of a current/resistance pair, $I_{guess}$ and $R_{guess}$, may be made using known current-dependent resistance relationship information. In certain embodiments, the current-dependent resistance relationship information may be similar to the exemplary information described above and illustrated in connection with FIG. 2B. At 506, a current, $I_{calc}$, may be calculated based on the guessed resistance $R_{guess}$ 404, a minimum voltage $V_{min}$, and an open circuit voltage $V_{min}$ (e.g., using Equation 3 presented above).

The calculated current, $I_{calc}$, may be compared to the guessed current, $I_{guess}$, at 508, and a determination based on the comparison may be made as to whether an absolute value of a difference between the calculated current, $I_{calc}$, and the guessed current, $I_{guess}$, is less than a threshold, $I_{threshold}$ (e.g., whether abs($I_{calc}-I_{guess}$)<$I_{threshold}$. If the difference is less than the threshold, the method 500 may proceed to 514, where a peak current may be determined to be the calculated current—that is $I_{peak}=I_{guess}$.

If the difference is greater than the threshold and the calculated current is less than the guessed current (i.e., $I_{calc}<I_{guess}$), the method may proceed to 512. At 512, a new current/resistance pair may be guessed having higher guessed current and lower guessed resistance values, and a new calculated current may be calculated at 504 based on the new guessed current/resistance values. If the difference is greater than the threshold and the calculated current is greater than the guessed current (i.e., $I_{calc}>I_{guess}$), the method may proceed to 510. At 510, a new current/resistance pair may be guessed having lower guessed current and higher guessed resistance values, and a new calculated current may be calculated at 504 based on the new guessed current/resistance values.

Once the determination at 508 results in an absolute value of the difference between the calculated current, $I_{calc}$, and a guessed current, $I_{guess}$, being less than the threshold, the method 500 may proceed to 514, where a peak current may be determined to be the calculated current. The method may then proceed to terminate at 516.

A compensation process for a regressed ohmic resistance of the battery system may be performed based on the determined peak current. As discussed above, a current associated with a regressed resistance may be an average over a number of samples considered by the regression method (e.g., $I_{avg}$). A regressed ohmic resistance, $R_{reg}$, may be scaled by a ratio of a peak current resistance, $R_{Ipeak}$, determined using an identified peak current, $I_{peak}$, and a nominal resistance based on the average current associated with the regression, $R_{avg}$, according to following:

$$R_{reg} \times \frac{R_{Ipeak}}{R_{avg}} = R_{power} \qquad \text{Eq. 4}$$

where $R_{reg}$ is a regressed ohmic resistance, $R_{Ipeak}$ is a resistance associated with an identified peak current by means of a relationship such as that shown in FIG. 2B, $R_{avg}$ is a nominalnominal resistance based on an average current associated with the regression, and $R_{power}$ is a compensated ohmic resistance that may be utilized in connection with power capability calculations consistent with embodiments disclosed herein. For example, the value of $R_{power}$ may be utilized in connection with Equation 1 in determining a peak power capability of a battery system. In certain embodiments, by scaling in this manner, information about aging of the battery that was present in the regressed resistance may be preserved in $R_{power}$.

In certain embodiments used in connection with voltage-limited power calculations, a peak current may be identified using the above-described methods. In further embodiments, such as systems and methods used in connection with current-limited power calculations, a battery manufacturer's maximum current limit may be used as the peak current.

Figure 6:
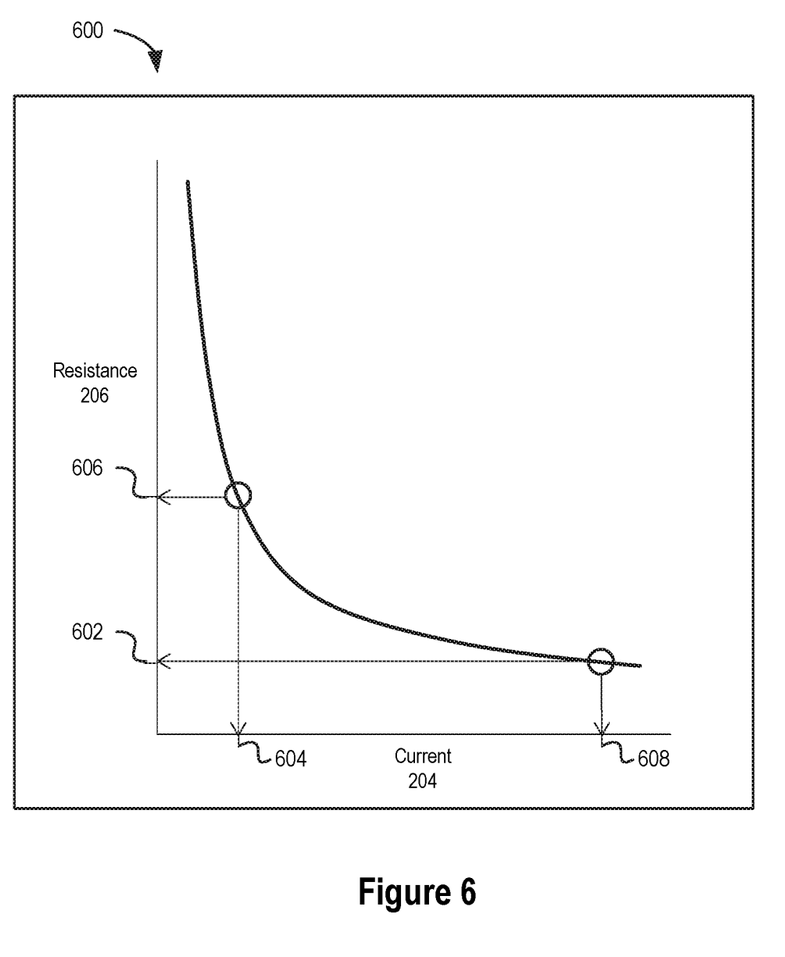
FIG. 6 illustrates a conceptual diagram showing relationships between various currents and resistances used in connection with determining an ohmic resistance in a battery system model consistent with embodiments disclosed herein

FIG. 6 illustrates a conceptual diagram 600 showing relationships between various currents and resistances used in connection with determining an ohmic resistance in a battery system model consistent with embodiments disclosed herein. Particularly, the illustrated diagram 600 may show information regarding a relationship between current 204 and resistance 206 (e.g., as discussed above in connection with graph 200b illustrated in FIG. 2B). Using the information illustrated in FIG. 6, a peak current resistance 602, $R_{Ipeak}$, may be identified from a calculated peak current 604, $I_{peak}$. Similarly, a nominal resistance 606, $R_{avg}$, may be identified based on an average current associated with the regression 608, $I_{avg}$.

Figure 7:
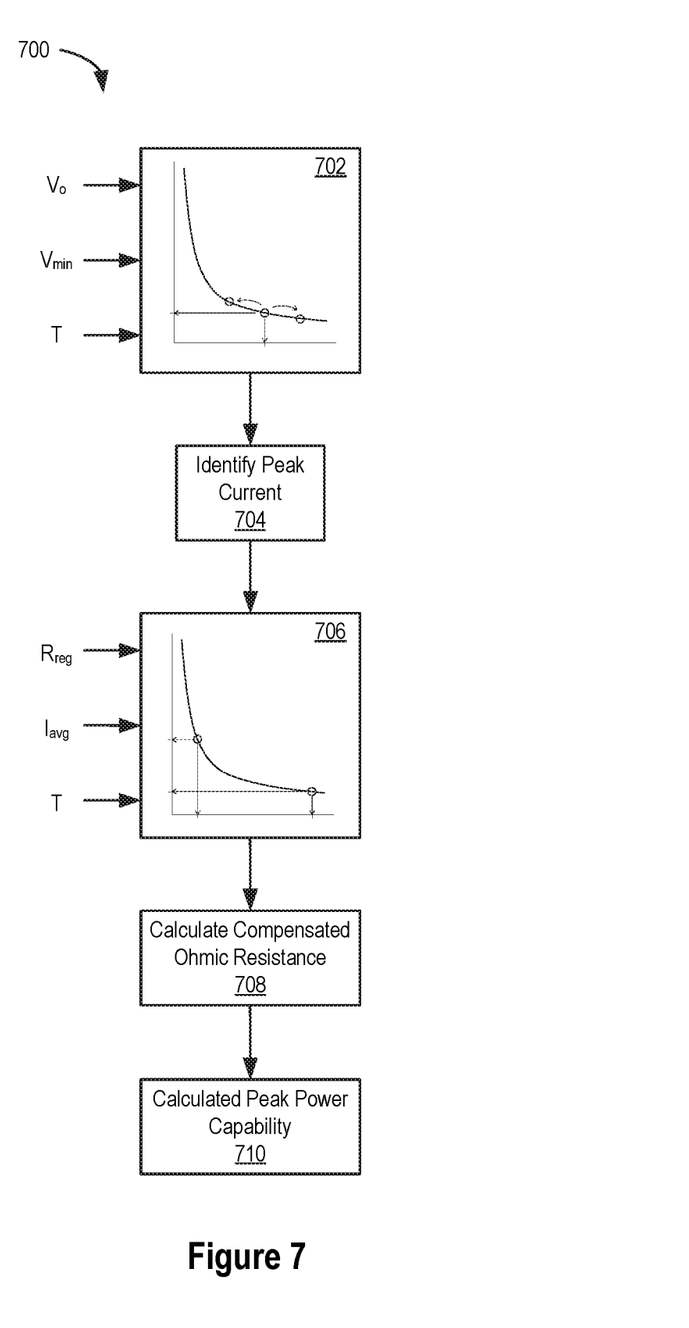
FIG. 7 illustrates a conceptual diagram of a method for determining a compensated ohmic resistance in a battery system model based on a peak current consistent with embodiments disclosed herein.

FIG. 7 illustrates a conceptual diagram 700 of a method for determining an ohmic resistance in a battery system model based on a peak current consistent with embodiments disclosed herein. More specifically, the illustrated diagram may be utilized in connection with determining a compensated ohmic resistance consistent with the disclosed systems and methods and/or an associated peak battery power capability.

Block 702 may perform a peak current search operation consistent with embodiments disclosed herein. In certain embodiments, the peak current search operation may implement certain embodiments of the processes described above in connection with FIG. 4 and FIG. 5. Various information may be used in connection with the peak current searching operation including, without limitation, a minimum voltage $V_{min}$, an open circuit voltage $V_o$, and a temperature T. In certain embodiments, such information may be provided by a system implementing certain BSE functionality.

Based on the search operation performed by block 702, a peak current, $I_{peak}$, may be identified at block 704. As discussed above, in certain embodiments, an identified peak current, $I_{peak}$, may be based on a type of power capability calculation being performed. For example, in connection with voltage-limited power calculations, a peak current may be identified using the searching operations described above. In connection with current-limited power calculations, a battery manufacturer's maximum current limit may be used as a peak current. In some embodiments, an identified peak current, may be based on the lower of a peak current identified using the searching operations described above (i.e., $I_{calc\,final}$) and a battery's maximum current limit (i.e., $I_{max}$) (e.g., $I_{peak}=\min(I_{calc\,final}, I_{max})$).

The peak current identified at block 704 may be passed to block 706, where an identification of variables used in calculating a compensated ohmic resistance for the battery system may be determined consistent with embodiments disclosed herein. In certain embodiments, this identification may implement certain embodiments of the processes described above in connection with FIG. 6. Variables identified at block 706 may include, without limitation, a peak current resistance, $R_{Ipeak}$, associated with an identified peak current and a nominal resistance, $R_{avg}$. Various information may be used in connection with the identification including, without limitation, a regressed resistance, $R_{reg}$, an average current associated with the regression, $I_{avg}$, and a temperature T. In certain embodiments, such information may be provided by a system implementing certain BSE functionality.

Based on the variables identified at block 706, a compensated ohmic resistance may be calculated at block 708 using, for example, Equation 4 as detailed above. The compensated ohmic resistance may be utilized at block 710 in connection with calculating a peak power capability of the battery system (e.g., using Equation 2 or the like).

Figure 8:
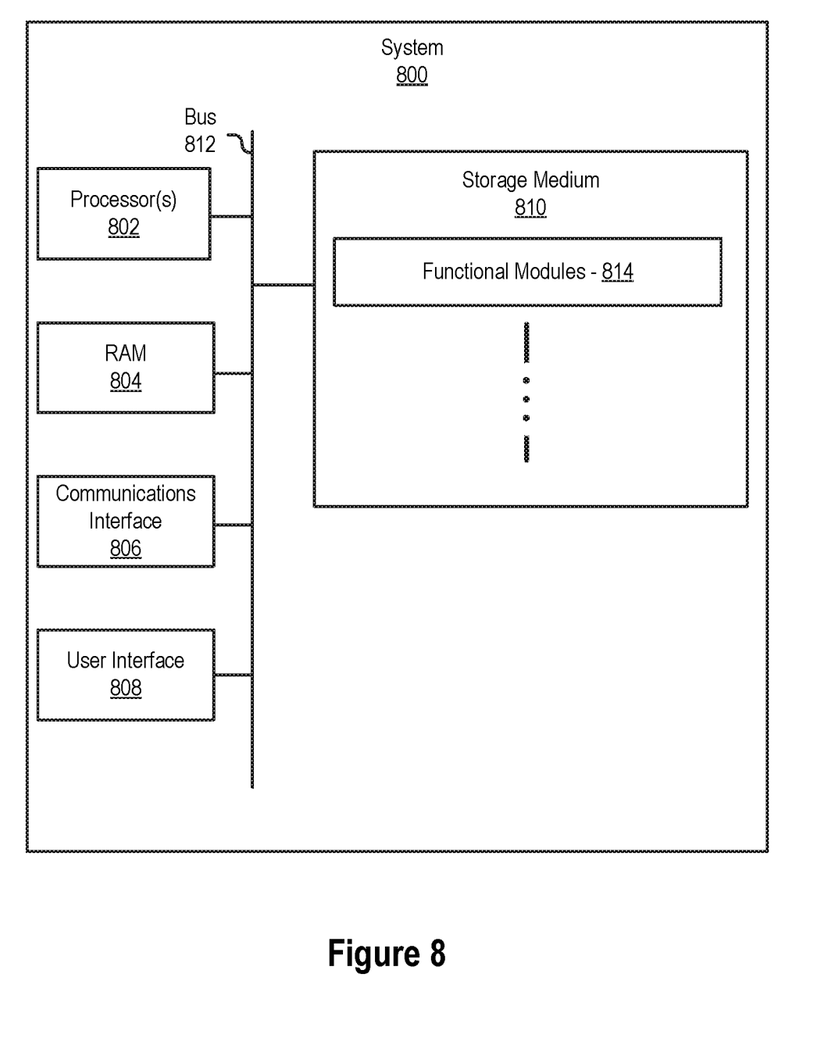
FIG. 8 illustrates an exemplary system for implementing certain embodiments of the systems and methods disclosed herein.

FIG. 8 illustrates an exemplary system 800 for implementing certain embodiments of the systems and methods disclosed herein. In certain embodiments, the computer system 800 may be a personal computer system, a server computer system, an on-board vehicle computer, a battery control system, an external computer system, and/or any other type of system suitable for implementing the disclosed systems and methods. In further embodiments, the computer system 800 may be any portable electronic computer system or electronic device including, for example, a notebook computer, a smartphone, and/or a tablet computer.

As illustrated, the computer system 800 may include, among other things, one or more processors 802, random access memory ("RAM") 804, a communications interface 806, a user interface 808, and a non-transitory computer-readable storage medium 810. The processor 802, RAM 804, communications interface 806, user interface 808, and computer-readable storage medium 810 may be communicatively coupled to each other via a common data bus 812. In some embodiments, the various components of the computer system 800 may be implemented using hardware, software, firmware, and/or any combination thereof.

User interface 808 may include any number of devices allowing a user to interact with the computer system 800. For example, user interface 808 may be used to display an interactive interface to a user. The user interface 808 may be a separate interface system communicatively coupled with the computer system 800 or, alternatively, may be an integrated system such as a display interface for a laptop or other similar device. In certain embodiments, the user interface 808 may be produced on a touch screen display. The user interface 808 may also include any number of other input devices including, for example, keyboard, trackball, and/or pointer devices.

The communications interface 806 may be any interface capable of communicating with other computer systems, peripheral devices, and/or other equipment communicatively coupled to computer system 800. For example, the communications interface 806 may allow the computer system 800 to communicate with other computer systems (e.g., computer systems associated with external databases and/or the Internet), allowing for the transfer as well as reception of data from such systems. The communications interface 806 may include, among other things, a modem, a satellite data transmission system, an Ethernet card, and/or any other suitable device that enables the computer system 800 to connect to databases and networks, such as LANs, MANs, WANs and the Internet.

Processor 802 may include one or more general purpose processors, application specific processors, programmable microprocessors, microcontrollers, digital signal processors, FPGAs, other customizable or programmable processing devices, and/or any other devices or arrangement of devices that are capable of implementing the systems and methods disclosed herein.

Processor 802 may be configured to execute computer-readable instructions stored on non-transitory computer-readable storage medium 810. Computer-readable storage medium 810 may store other data or information as desired. In some embodiments, the computer-readable instructions may include computer executable functional modules 814. For example, the computer-readable instructions may include one or more functional modules configured to implement all or part of the functionality of the systems and methods described above. Specific functional models that may be stored on computer-readable storage medium 810 may include modules to test, monitor, and/or model peak power capability of a battery system and/or any other module or modules configured to implement the systems and methods disclosed herein.

The system and methods described herein may be implemented independent of the programming language used to create the computer-readable instructions and/or any operating system operating on the computer system 800. For example, the computer-readable instructions may be written in any suitable programming language, examples of which include, but are not limited to, C, C++, Visual C++, and/or Visual Basic, Java, Perl, or any other suitable programming language. Further, the computer-readable instructions and/or functional modules may be in the form of a collection of separate programs or modules, and/or a program module within a larger program or a portion of a program module. The processing of data by computer system 500 may be in response to user commands, results of previous processing, or a request made by another processing machine. It will be appreciated that computer system 500 may utilize any suitable operating system including, for example, Unix, DOS, Android, Symbian, Windows, iOS, OSX, Linux, and/or the like.

Although the foregoing has been described in some detail for purposes of clarity, it will be apparent that certain changes and modifications may be made without departing from the principles thereof. It is noted that there are many alternative ways of implementing both the processes and systems described herein. Accordingly, the present embodiments are to be considered illustrative and not restrictive, and the invention is not to be limited to the details given herein, but may be modified within the scope and equivalents of the appended claims.

The foregoing specification has been described with reference to various embodiments. However, one of ordinary skill in the art will appreciate that various modifications and changes can be made without departing from the scope of the present disclosure. For example, various operational steps, as well as components for carrying out operational steps, may be implemented in alternate ways depending upon the particular application or in consideration of any number of cost functions associated with the operation of the system. Accordingly, any one or more of the steps may be deleted, modified, or combined with other steps. Further, this disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced, are not to be construed as a critical, a required, or an essential feature or element.

As used herein, the terms "comprises" and "includes," and any other variation thereof, are intended to cover a non-exclusive inclusion, such that a process, a method, an article, or an apparatus that comprises a list of elements does not include only those elements but may include other elements not expressly listed or inherent to such process, method, system, article, or apparatus. Also, as used herein, the terms "coupled," "coupling," and any other variation thereof are intended to cover a physical connection, an electrical connection, a magnetic connection, an optical connection, a communicative connection, a functional connection, and/or any other connection.

Those having skill in the art will appreciate that many changes may be made to the details of the above-described embodiments without departing from the underlying principles of the invention. The scope of the present invention should, therefore, be determined only by the following claims.

The invention claimed is:

1. A method of determining a peak power capability of a battery system comprising:
   identifying a peak current of the battery system;
   determining a regressed ohmic resistance in a battery system model used to model the battery system;
   scaling the regressed ohmic resistance to calculate a compensated ohmic resistance of the battery system model based on the peak current;
   determining a peak power capability of the battery system based on the compensated ohmic resistance and the battery system model; and
   implementing a control action in a vehicle associated with the battery system based on the determined peak power capability.

2. The method of claim 1, wherein the peak power capability comprises a current-limited peak power capability and the peak current of the battery system comprises a maximum current limit of the battery system.

3. The method of claim 1, wherein the peak power capability comprises a voltage-limited peak power capability and identifying the peak current comprises:
   generating a guessed current;
   determining a guessed resistance based on the guessed current using current dependent resistance information;
   determining a calculated current based on the guessed resistance; and
   determining whether a difference between the calculated current and the guessed current is below a threshold.

4. The method of claim 3, wherein if the difference between the calculated current and the guessed current is below the threshold, identifying the peak current comprises:
   identifying the calculated current as the peak current.

5. The method of claim 3, wherein if the difference between the calculated current and the guessed current is not below the threshold, identifying the peak current comprises:
   iteratively generating subsequent guessed currents, determining subsequent guessed resistances based on the subsequent guessed currents, and determining subsequent calculated currents based on the subsequent guessed currents until a difference between a final subsequent calculated current and a final subsequent guessed current is below the threshold; and
   identifying the final subsequent calculated current as the peak current.

6. The method of claim 1, wherein scaling the regressed ohmic resistance to calculate a compensated ohmic resistance further comprises:
   determining a peak resistance based on the peak current;
   determining a nominal resistance based on an average current associated with a regression operation used to calculate the regressed ohmic resistance; and
   scaling the regressed ohmic resistance by a ratio of the peak resistance to the nominal resistance to calculate the compensated ohmic resistance.

7. The method of claim 1, wherein the model comprises a circuit model including elements configured to model ohmic resistance, charge transfer, and mass transfer processes of the battery system.

8. The method of claim 1, wherein the control action comprises an action associated with a regenerative braking acceptance setting of the vehicle.

9. The method of claim 1, wherein the control action comprises an action associated with a maximum allowed vehicle acceleration.

10. The method of claim 1, wherein the control action comprises an action associated with initiation of an electric drivetrain system of the vehicle.

11. A non-transitory computer-readable medium comprising instructions that, when executed by a processor, cause the processor to perform a method of determining a peak power capability of a battery system, the method comprising:
   identifying a peak current of the battery system;
   determining a regressed ohmic resistance in a battery system model used to model the battery system;
   scaling the regressed ohmic resistance to calculate a compensated ohmic resistance of the battery system model based on the peak current;
   determining a peak power capability of the battery system based on the compensated ohmic resistance and the battery system model; and
   implementing a control action in a vehicle associated with the battery system based on the determined peak power capability.

12. The non-transitory computer-readable medium of claim 11, wherein the control action comprises an action associated with a regenerative braking acceptance setting of the vehicle.

13. The non-transitory computer-readable medium of claim 11, wherein the peak power capability comprises a current-limited peak power capability and the peak current of the battery system comprises a maximum current limit of the battery system.

14. The non-transitory computer-readable medium of claim 11, wherein the peak power capability comprises a voltage-limited peak power capability and identifying the peak current comprises:
generating a guessed current;
determining a guessed resistance based on the guessed current using current dependent resistance information;
determining a calculated current based on the guessed resistance; and
determining whether a difference between the calculated current and the guessed current is below a threshold.

15. The non-transitory computer-readable medium of claim 14, wherein if the difference between the calculated current and the guessed current is below the threshold, identifying the peak current comprises:
identifying the calculated current as the peak current.

16. The non-transitory computer-readable medium of claim 14, wherein if the difference between the calculated current and the guessed current is not below the threshold, identifying the peak current comprises:
iteratively generating subsequent guessed currents, determining subsequent guessed resistances based on the subsequent guessed currents, and determining subsequent calculated currents based on the subsequent guessed currents until a difference between a final subsequent calculated current and a final subsequent guessed current is below the threshold; and
identifying the final subsequent calculated current as the peak current.

17. The non-transitory computer-readable medium of claim 11, wherein scaling the regressed ohmic resistance to calculate a compensated ohmic resistance further comprises:
determining a peak resistance based on the peak current;
determining a nominal resistance based on an average current associated with a regression operation used to calculate the regressed ohmic resistance; and
scaling the regressed ohmic resistance by a ratio of the peak resistance to the nominal resistance to calculate the compensated ohmic resistance.

18. The non-transitory computer-readable medium of claim 11, wherein the control action comprises an action associated with a maximum allowed vehicle acceleration.

19. The non-transitory computer-readable medium of claim 11, wherein the control action comprises an action associated with initiation of an electric drivetrain system of the vehicle.

* * * * *